United States Patent [19]

Kano et al.

[11] Patent Number: 5,903,708
[45] Date of Patent: *May 11, 1999

[54] MAGNETO-RESISTANCE EFFECT DEVICE WITH IMPROVED THERMAL RESISTANCE

[75] Inventors: Hiroshi Kano; Atsuko Suzuki; Toshihiko Yaoi, all of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/453,788

[22] Filed: May 30, 1995

[30] Foreign Application Priority Data

May 30, 1994 [JP] Japan ................... 6-117089
Aug. 25, 1994 [JP] Japan ................... 6-200881
Sep. 8, 1994 [JP] Japan ................... 6-214961

[51] Int. Cl.[6] .................................................. H01L 43/00
[52] U.S. Cl. ........................................ 388/32 R; 360/113
[58] Field of Search ....................... 338/32 R; 360/113, 360/126; 427/128, 132; 324/252

[56] References Cited

U.S. PATENT DOCUMENTS

| 4,724,188 | 2/1988 | Saito et al. ............... 338/32 R |
| 4,755,897 | 7/1988 | Howard ................... 360/113 |
| 4,783,711 | 11/1988 | Kitada et al. ............. 360/113 |
| 4,858,049 | 8/1989 | Kobayashi et al. ......... 360/126 |
| 5,159,513 | 10/1992 | Dieny et al. .............. 360/113 |
| 5,173,823 | 12/1992 | Hasegawa ................ 360/126 |
| 5,243,316 | 9/1993 | Sakakima et al. .......... 338/32 R |
| 5,287,237 | 2/1994 | Kitada et al. ............. 360/113 |
| 5,315,282 | 5/1994 | Shinjo et al. ............. 338/32 R |
| 5,365,212 | 11/1994 | Saito et al. .............. 338/32 R |
| 5,432,645 | 7/1995 | Terunuma et al. .......... 360/126 |
| 5,439,754 | 8/1995 | Iwasaki et al. ............ 360/126 |
| 5,441,804 | 8/1995 | Akitake et al. ............ 427/128 |
| 5,462,795 | 10/1995 | Shinjo et al. ............. 428/332 |
| 5,498,298 | 3/1996 | Wecker et al. ............ 148/105 |
| 5,514,452 | 5/1996 | Araki et al. .............. 324/252 |
| 5,521,005 | 5/1996 | Kitada et al. ............. 360/113 |
| 5,528,440 | 6/1996 | Fontana et al. ............ 360/113 |
| 5,568,115 | 10/1996 | Kano et al. ............... 338/32 R |
| 5,585,196 | 12/1996 | Inomata et al. ............ 360/126 |
| 5,725,963 | 3/1998 | Iwasaki et al. ............ 360/113 |

FOREIGN PATENT DOCUMENTS

| 0581295 | 2/1994 | European Pat. Off. ............. 338/32 R |
| 0 590 434 A1 | 4/1994 | European Pat. Off. . |
| 3622241 A1 | 1/1987 | Germany . |
| 59-46078 | 3/1984 | Japan ................... 338/32 R |
| 62-033317 | 2/1987 | Japan . |
| 4-137572 | 5/1992 | Japan ................... 338/32 R |

OTHER PUBLICATIONS

M.N. Baibich, et al., Giant Magnetoresistance of (001)Fe/ (001)CR Magnetic Superlattices, Physical Review Letters, vol. 61, No. 21, pp. 2472–2475 (1988).

S.S. Parking, et al., "Oscillatory Magnetic Exchange Coupling Through Thin Copper Layers," Physical Review Letters, vol. 66, No. 16, pp. 2152–2155 (1991).

B. Dieny et al., "Spin–Valve Effect in Soft Ferromagnetic Sandwiches," Journal of Magnetism and Magnetic Materials, 93, pp. 101–104 (1992).

J.M. Daughton et al., "GMR Materials for Low Field Applications", 8108 IEEE Transactions on Magnetics, 29 (1993) Nov., No. 6, New York, US, pp. 2705–2710.

Primary Examiner—Michael L. Gellner
Assistant Examiner—Karl Easthom
Attorney, Agent, or Firm—Hill & Simpson

[57] ABSTRACT

A magneto-resistance effect film of an artificial lattice film structure having an alternate lamination of a conductor layer and a magnetic layer, or a magneto-resistance effect film of a spin bulb structure having a lamination of a magnetic layer, a conductor layer and a magnetic layer in that order. The conducting layer is mainly composed of an element selected from the group consisting of Cu, Ag and Cr and also contains 0.1 to 30 atomic percent of an addition element having an upper limit of solid solution at room temperature with respect to the element as the main component of not more than 1 percent. Alternatively, the magnetic layer is mainly composed of Fe, Co or Ni and also contains 0.1 to 30 atomic percent of an addition element having an upper limit of solid solution at room temperature with respect to the element as the main component of not more than 1%. Additionally, the thermal resistance can be improved by utilizing a base plate with a heat conductivity of not less than 2 W/mK.

29 Claims, 8 Drawing Sheets

MAGNETO-RESISTANCE EFFECT DEVICE WITH IMPROVED THERMAL RESISTANCE

BACKGROUND OF THE INVTION

The present invention relates to magneto-resistance effect devices, and in particular, magneto-resistance effect films. Such films can be used for magnetic field detection, e.g., in a playback head for a magnetic disk device or a magnetic field sensor.

Magneto-resistance effect films, exhibiting magneto-resistance (MR) effect, are employed as devices for detecting magnetic fields, and are widely employed in the field of magnetic sensors or magnetic heads.

Up to now, an Fe-Ni alloy film (so-called permalloy film) has been mainly used as the magneto-resistance effect film. However, permalloy film has only a small rate of change of magneto-resistance such that a magnetic head employing a permalloy film cannot be said to have sufficient sensitivity for coping with anticipated high density recording.

An artificial lattice film having a lamination of a magnetic film of Fe and a conductor film (non-magnetic film) of Cr has been reported to have the rate of change of magneto-resistance amounting to multiples of ten percent. See, Physical Review letters, vol. 61, page 2472, 1988. This is referred to as the Giant Magneto-Resistance (GMR) effect. There are high expectations of applying GMR to magneto-resistance devices.

In addition to the combination of the Fe layer and the Cr layer, the combination of a magnetic film of Co and a non-magnetic film of Cu has also be reported to exhibit the giant magneto-resistance effect. See, Physical Review letters, vol.66, page 2152, 1991.

It has also been reported that, by employing an alloy of three elements, namely iron, nickel and cobalt, in a layer of a magnetic material, a larger change in resistance may be produced for a small change in the magnetic field, such that sensitivity to an external magnetic field may be improved and hence the artificial lattice film is effective from the practical standpoint.

It has also been reported that the giant magneto-resistance effect can be achieved with a laminated film consisting of a magnetic layer, a conductor layer and a magnetic layer, in that order. This is a so-called spin bulb film. See, Journal of Magnetism and Magnetic Materials, vol.93, page 101, 1991.

However, a magneto-resistance effect film, having the above-described laminated film structure, is susceptible to diffusion among respective films due to heat. Thus, the above disclosed magneto-resistance effect films have a drawback that magneto-resistance effect characteristics tend to deteriorate under elevated temperatures.

This deterioration in the magneto-resistance effect can be caused by current flowing through the MR device at a high current density during operation of the device. This is possibly ascribable to the fact that the current flowing at a high current density during the operation leads to heat evolution and to a disturbed array of magnetization in the multi-layer magneto-resistance effect film construction.

SUMMARY OF THE INVENTION

It is an object of the present invention to provide a magneto-resistance effect film which is less prone to deterioration with respect to its magneto-resistance effect characteristics under elevated temperatures and in which a giant magneto-resistance effect may be achieved with stability.

In that regard, the giant magneto-resistance effect observed with the multi-layer magneto-resistance effect film of the artificial lattice structure comprised of alternate lamination of a conductor layer and a magnetic layer is thought to be ascribable to the RKKY (Rudermann, Kittel, Kasuya and Yoshida) interaction between the magnetic layers via conducting electrons in the conductor and to resultant diamagnetic coupling of the magnetic layers facing each other to produce a state of anti-parallel spin and a resultant spin-dependent scattering with consequent high magneto-resistance effect.

With the magneto-resistance effect film of a spin bulb structure mainly composed of a three-layer structure comprising a magnetic layer, a conductor layer and a magnetic layer, laminated in this order, it is thought that the state of anti-parallel spin is similarly produced thus producing spin-dependent scattering and consequent high magneto-resistance effect.

Although it is when the state of anti-parallel spin can be achieved that the high magneto-resistance effect is achieved with the above structure, the state of anti-parallel spin is significantly influenced by heat.

The present inventors have conducted investigations and found out that, by adding an element less prone to solid solution in the conductor layer, the state of anti-parallel spin is affected to a lesser extent by heat thus making it possible to prevent the magneto-resistance effect characteristics from deteriorating under elevated temperatures.

In an embodiment, the invention provides an artificial lattice film structure having an alternate lamination of a conductor layer and a magnetic layer, wherein the conductor layer mainly comprises an element selected from the group consisting of Cu, Ag and Cr and 0.1 to 30 atomic percent of an addition element having an upper limit of solid solution at room temperature with respect to the selected element as a main component of not more than 1%.

In another embodiment, the invention provides a magneto-resistance effect film with a spin bulb structure that has a lamination of a magnetic layer, a conductor layer and a magnetic layer in that order, wherein the conductor layer mainly comprises an element selected from the group consisting of Cu, Ag and Cr and 0.1 to 30 atomic percent of an addition element having an upper limit of solid solution at room temperature with respect to the selected element as a main component of not more than 1%.

If the main component of the conductor layer is Cu, preferably the addition element contained in the conductor layer is an element selected from the group consisting of Ag, B, Bi, C, Co, Fe, Hg, Ir, Mo, Na, Nb, Pb, Pt, V and Zr. However, if the main component of the conductor layer is Ag, preferably the addition element contained in the conductor layer is an element selected from the group consisting of Be, Bi, Co, Cr, Cu, Fe, Ge, Ir, Ni, Pb, Si an U.

The magnetic layer preferably is formed of a magnetic material which is comprised of at least one element from a group of Fe, Co, Ni, Cr, V, Mo, Nb, Ta, W, Re, Ru, Cu, Rh, Pd, Ir, Pt, B, C, N, O, Si, Al, Ga, Ge, Sn and Sb and which shows magnetic properties at room temperature. The magnetic layer preferably is formed of a material containing 1 to 50 atomic percent of Cu and containing at least one or more of the elements Fe, Co and Ni. For improving the sensitivity to an external magnetic field, the elements Fe, Co and Ni contained in the magnetic layer are preferably of the following composition.

$Fe_xCo_yNi_z$, where x, y and z stand for atomic percent, and $5 \leq x \leq 40$, $20 \leq y \leq 90$, $5 \leq z \leq 70$ and $x+y+z=100$.

On the other hand, the invention provides a magneto-resistance effect film of an artificial lattice film structure having an alternate lamination of a conductor layer and a magnetic layer, wherein the magnetic layer mainly comprises Fe, Co or Ni and contains 0.1 to 30 atomic percent of an addition element having an upper limit of solid solution at room temperature with respect to the selected element of not more than 1%. Alternatively, the magneto-resistance effect film is a magneto-resistance effect film of a spin bulb structure having a lamination of a magnetic layer, a conductor layer and a magnetic layer, in that order, wherein the magnetic layer mainly comprises Fe, Co or Ni and also contains 0.1 to 30 atomic percent of an addition element having an upper limit of solid solution at room temperature with respect to the element as a main component of not more than 1%.

Meanwhile, in the above magneto-resistance effect film, the addition element contained in the magnetic layer is an element selected from the group consisting of Ag, B, Bi, C, Co, Fe, Hg, Ir, Li, Mo, Na, Nb, Pb, V, Pt and Zr.

It is another object of the present invention to provide a magneto-resistance effect device in which the giant magneto-resistance effect is produced and the magneto-resistance effect may be prohibited from being deteriorated during operation due to heat.

To that end, the present inventors, after conducting extensive investigations, found that by employing a base plate having high heat conductivity, the magneto-resistance effect may be prevented from being deteriorated even if the current is caused to flow at a high current density.

In an embodiment, the present invention provides a magneto-resistance effect device having a multi-layer magneto-resistance effect film construction of magnetic and non-magnetic resistance effect films formed on a base plate, wherein the base plate has heat conductivity of not less than 2 W/mK.

If the magneto-resistance effect device is applied to, for example, a magnetic head, it can be subjected to a current of $1 \times 10^6$ to $9 \times 10^6$ A/cm$^2$. If the heat conductivity of the base plate is less than 2 W/mK, the magneto-resistance effect (rate of change of magneto-resistance) is abruptly lowered when the current exceeds the current density of $1 \times 10^6$ A/cm$^2$. E.g., if a current with a current density of $9 \times 10^6$ A/cm$^2$ is caused to flow, the rate of change of magneto-resistance is less than 20% of that with a current having a current density of $1 \times 10^5$ A/cm$^2$.

As to the make-up of the base plate, there is no limitation to the base plate if it has heat conductivity not lower than 2 W/mK. Thus it is possible to employ a ceramic base plate, such as NiO—MnO, a ferrite base plate of Mn—Zn ferrite, Ni—Zn ferrite or the like, or a base plate of a single crystal, such as GaAs, Si or MgO base plate, in view of epitaxial growth. If the ferrite base plate is employed, it is desirable to process its surface with a non-magnetizing treatment. For prohibiting the lattice of the artificial lattice film from becoming distorted on application of an external force to the magneto-resistance effect device, the base plate preferably has a Young's modulus of not lower than $1 \times 10^9$ Nm$^{-2}$.

The multi-layer magneto-resistance effect film construction formed on such base plate may be formed as an artificial lattice film comprised of magnetic film and non-magnetic films alternately laminated with each other in this order.

Regardless as to whether the multi-layer magneto-resistance effect film construction is of the artificial lattice film structure or the spin bulb structure, it is possible to use that non-magnetic film which remains non-magnetic at room temperature and which is formed by a conductor formed of at least one element selected from among Fe, Co, Ni, Cr, V, Mo, Nb, Ta, W, Re, Ru, Cu, Rh, Pd, Ir, Pt, B, C, N, O, Si, Al, Ga, Ge, Sn, Sb and Ag. If the film mainly composed of at least one element selected from among Cu, Ag and Cr is employed, a multi-layer magneto-resistance effect film construction exhibiting the giant magneto-resistance effect may be produced.

The film thickness of the non-magnetic film preferably is 1.8 to 2.8 nm. The magneto-resistance effect varies with the film thickness of the magnetic film as well, such that, if the film thickness is thinner or thicker than the above range, the magneto-resistance effect is deteriorated.

As the magnetic film constituting the multi-layer magneto-resistance effect film construction, such a magnetic film may be used which remains magnetic at room temperature and which is formed of at least one element selected from among Fe, Co, Ni, Cr, V, Mo, Nb, Ta, W, Re, Ru, Cu, Rh, Pd, Ir, Pt, B, C, N, O, Si, Al, Ga, Ge, Sn and Sb.

Above all, such a magnetic film is preferred which contains 1 to 50 atom percent of Cu and which contains at least one element selected from among Fe, Co and Ni. The following composition for Fe, Co and Ni contained in the magnetic film is preferred for improving sensitivity with respect to the external magnetic field.

$Fe_x Co_y Ni_z$, where x, y and z denote atomic percent and $5 \leq x \leq 40$, $20 \leq y \leq 90$ and $5 \leq z \leq 70$, with $x+y+z=100$.

With the above artificial lattice film, the magnetic film may be formed by lamination of Ni and Fe films, lamination of Ni alloy and Fe alloy films, a Ni—Fe alloy film and lamination of plural Ni—Fe alloy films with different compositions. Soft magnetic films may be formed as upper and lower layers of the above artificial lattice film. Although any of conventional materials exhibiting soft magnetic properties may be employed as the soft magnetic film, the Ni—Fe based alloy is most preferred.

With the thicknesses $t_A$, $t_B$ of the magnetic and non-magnetic films making up the artificial lattice film, the number of sets n of the alternately laminated magnetic and non-magnetic films and the total film thickness T, it is preferred that the relations 0.5 nm $\leq t_A$, $t_B \leq 50$ nm, $1 \leq n \leq 30$ and 5 nm $\leq T \leq 100$ nm hold. However, as explained herein, the following relationships are most preferred: $0.8 \leq t_A \leq 2$ nm and $1.8 \leq t_B < 2.8$ nm.

On the other hand, a diamagnetic film may be provided on at least one lateral surface of the spin bulb film. Although there is no limitation to the material constituting the diamagnetic layer, such materials as Fe—Mn, NiO, CoO, NiCoO or Tb—Co are preferred.

With $t_A$, $t_B$ and $t_C$ being the thickness of a magnetic layer, the thickness of a conductive layer, the thickness of a diamagnetic layer, and total thickness, respectively, in a spin bulb structure, these thickness preferably are:

0.5 nm $\leq t_A$, $t_B \leq 50$ nm, $0.5 \leq t_C \leq 200$, and 2 nm $\leq t \leq 350$ nm.

With any of the multi-layer magneto-resistance effect film constructions, the amount of oxygen contained in the non-magnetic and magnetic films is preferably 7 atom percent or less for producing the giant magneto-resistance effect in stability.

For forming films of various materials making up the multi-layer magneto-resistance effect film construction, any of conventional film-forming techniques may be employed, such as vacuum deposition, sputtering or ion plating. However, for forming alloy films, it is preferred to resort to sputtering employing a target having a composition corresponding to that of the alloy. As the sputtering technique, RF magnetron, DC magnetron or facing target systems are effective. However, since the magneto-resistance effect of the produced multi-layer magneto-resistance effect film also differs with film-forming conditions, such as gas pressure, it is necessary to optimize the film-forming conditions appropriately.

The magneto-resistance effect of the above-described magneto-resistance effect device may be found by measuring the magneto-resistance by a four-terminal method and calculating the rate of change of the measured values of magneto-resistance.

These and other features and aspects of the invention are described below in the following detailed description of the presently preferred embodiments with reference to the accompanying drawings.

DETAILED DESCRIPION OF THE PRESENTLY PREFERRED EMBODIMENTS

Set forth below are descriptions of various examples of MR films that exhibit the improved thermal resistance characteristics resulting from the inventive formulations. Reference is made in part to the accompanying drawings to explain the invention and resulting characteristics.

In a magneto-resistance effect film of the artificial lattice film structure or of the spin bulb structure, by adding 0.1 to 30 atom percent of the addition element difficult to form a solid solution with the element of the main component of the conductor layer to the conductor layer, or by adding 0.1 to 30 atom percent of an addition element difficult to form a solid solution with the element of the main component of the magnetic layer to the magnetic layer, the magneto-resistance effect characteristics are less liable to deteriorate under elevated temperatures, thus enabling the giant magneto-resistance effect to be produced stably.

EXAMPLE 1

Figure 1:
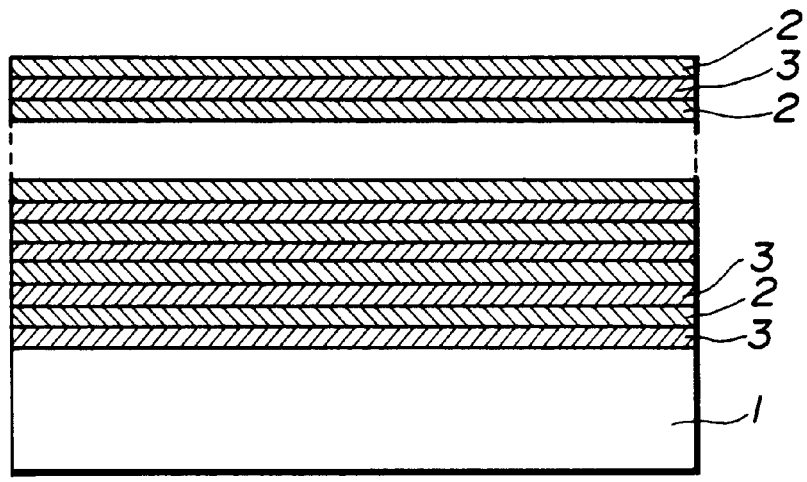
FIG. 1 is an enlarged schematic cross-sectional view showing an illustrative magneto-resistance effect film of an artificial lattice film structure according to the present invention.

Using a sputtering device, a layer of magnetic material of $Fe_{20}Ni_{45}Co_{35}$ 1.0 nm in thickness, and a conductor layer 3, 2.1 nm in thickness, mainly composed of Cu and admixed with Ag, an element less prone to form a solid solution with Cu, were alternately laminated with 30 iterations to form a magneto-resistance effect film of an artificial lattice film structure on a NiZn ferrite base plate 1 having a heating conductivity of about 7.5 W/mK, as shown in FIG. 1.

Figure 2:
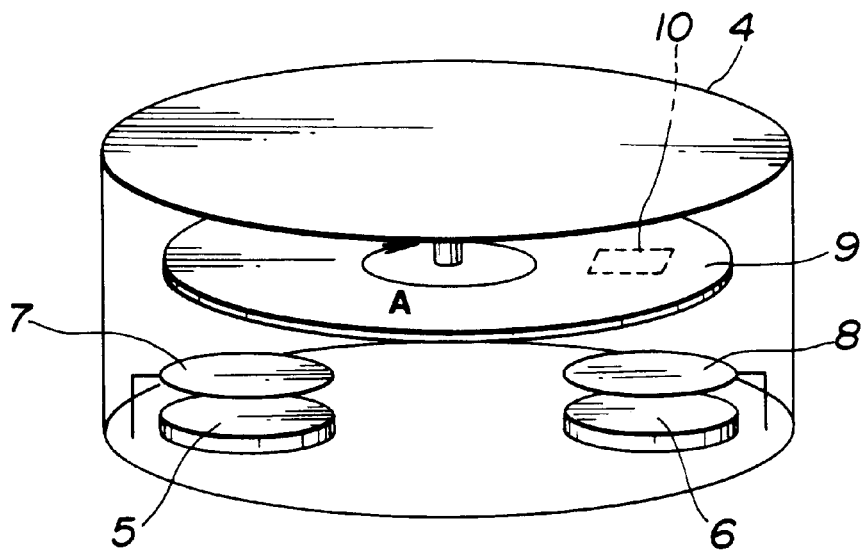
FIG. 2 is a schematic perspective view showing an illustrative construction of a sputtering device employed for fabrication of the magneto-resistance effect film according to the present invention.

Referring to FIG. 2, the sputtering device used has a vacuum vessel 4 within which are contained two targets 5, 6, two shutters 7, 8 arranged facing the targets 5, 6 and adapted for being opened and closed for controlling the film thickness, and a turntable 9 rotated on the targets 5 and 6. A base plate 10 is affixed on the turntable 9 for facing the targets 5 and 6 via the shutters 7 and 8 so that the base plate alternately travels over the targets 5 and 6 by rotation A of the turntable 9. Thus, the magnetic layers and the conductor layers were alternately laminated on the base plate 10.

For forming the above magneto-resistance effect film of the artificial lattice film structure, the following film forming conditions for the respective films were set:

Sputtering gas: argon

Sputtering gas pressure: 0.3 Pa

Power: 300 W

Film forming rate: 0.1 to 0.5 nm/sec.

With the above magneto-resistance film, Ag was added to Cu as the main component of the conductor layer by performing sputtering after setting an Ag chip 3 mm in diameter and 2 mm in thickness on a Cu target, such as a target 5. The amount of the addition of Ag was controlled depending on the number of chips set on the Cu target.

The effect of the amount of addition of Ag on the thermal resistance of the magneto-resistance effect film was measured. Using magneto-resistance effect films, produced as described above with the amounts of Ag to the conductor layer set to 0.1, 5, 30 and 40 atomic percent, and a magneto-resistance effect film f6rmed without adding Ag as a comparative example, heat-treatment was carried out on these magneto-resistance effect films in a vacuum at 230° C., 260° C., 290° C. and 320° C. for one hour. The rate of change of magneto-resistance was checked for each film. The results are shown in FIG. 3.

Figure 3:
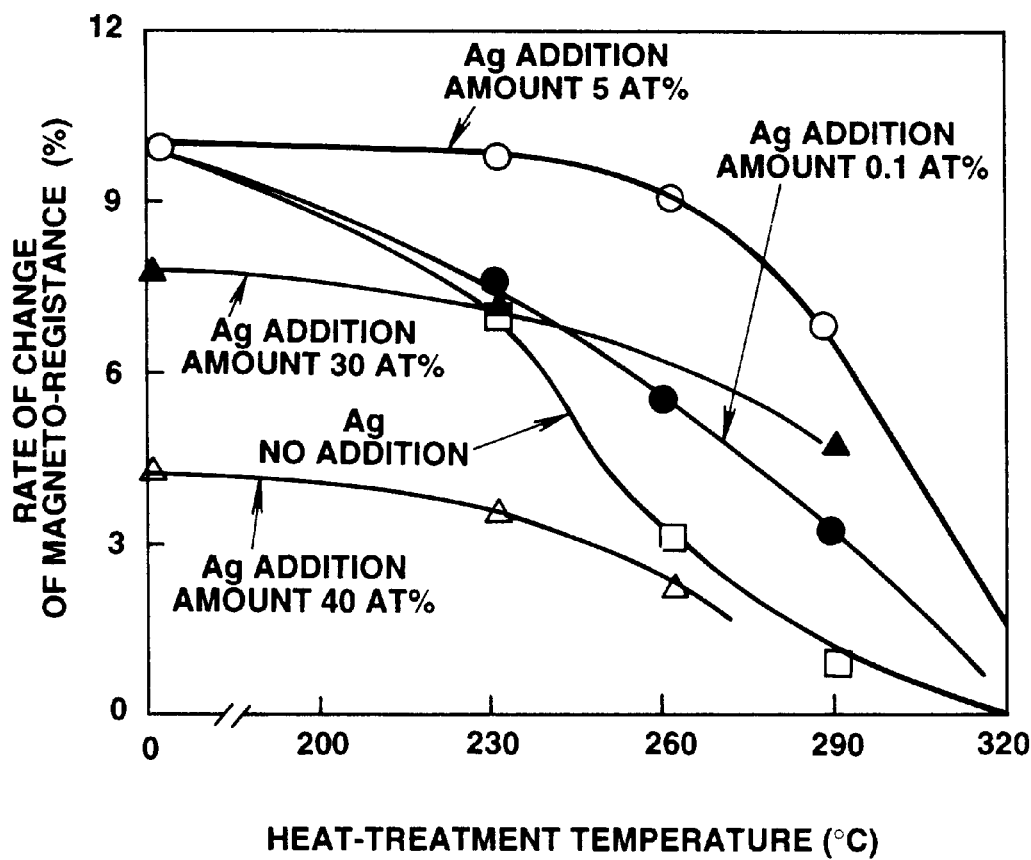
FIG. 3 is a graph showing the results of measurement of the change in the rate of change of magneto-resistance on heat treatment of the magneto-resistance effect film of an artificial lattice film structure the main component of the conductor layer of which is Cu, for different amounts of addition of Ag to the conductor layer.

It is seen from the results shown in FIG. 3 that addition of Ag to the conductor layer is effective to prevent thermal deterioration of the magneto-resistance effect. It is also seen that, if Ag is added in an amount exceeding 0.1 atomic percent, the effect of preventing thermal deterioration is noticed. However, it is also seen that, if Ag is added in an amount of 40 atomic percent, the magneto-resistance effect in the initial state prior to heat treatment (rate of exchange of magneto-resistance) is unfavorably decreased. That is, Ag is to be added in an amount preferably of 1 to 30 atomic percent.

EXAMPLE 2

A magneto-resistance effect film was formed in the same way as in Example 1, except using Pt in place of Ag as an addition element to the conductor layer. For adding Pt, sputtering was carried out after setting a Pt chip 3 mm in diameter and 2 mm in thickness on a Cu target. The amount of the addition of Pt was controlled depending on the number of chips set on the Cu target.

The effect of the amount of addition of Pt on the thermal resistance of the magneto-resistance effect film was measured. Using magneto-resistance effect films, produced as described above with the amounts of Pt to the conductor layer set to 0.1, 5, 30 and 40 atomic percents, and a magneto-resistance effect film formed without adding Pt, as a comparative example, heat-treatment was carried out on these magneto-resistance effect films in a vacuum at 230° C., 260° C., 290° C. and 320° C. for one hour. The rate of change of magneto-resistance was checked of each film. The results are shown in FIG. 4.

Figure 4:
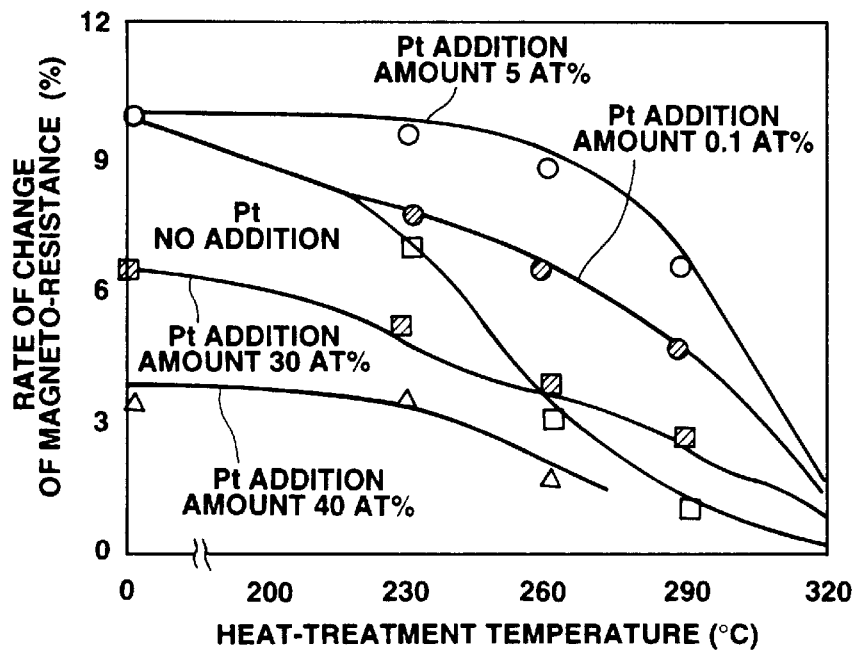
FIG. 4 is a graph showing the results of measurement of the change in the rate of change of magneto-resistance on heat treatment of the magneto-resistance effect film of an artificial lattice film structure the main component of the conductor layer of which is Cu, for different amounts of addition of Pt to the conductor layer.

It is seen from the results shown in FIG. 4 that addition of Pt to the conductor layer is effective to prevent thermal deterioration of the magneto-resistance effect. It is also seen that, if Pt is added in an amount exceeding 0.1 atomic percent, the effect of preventing thermal deterioration is noticed. However, it is also seen that, if Pt is added in an amount of 40 atomic percent, the magneto-resistance effect in the initial state prior to heat treatment (rate of change of magneto-resistance) is unfavorably decreased. That is, Pt is to be added in an amount preferably of 1 to 30 atomic percent.

In Example 1, Ag was added to a conductor layer of a magneto-resistance effect film of an artificial lattice film structure the main component of the conductor layer of which is Cu, whereas, in Example 2, Pt was added to a conductor layer of a magneto-resistance effect film of an artificial lattice film structure the main component of the conductor layer of which is Cu. In addition, the magneto-resistance effect is seen to be improved in thermal resistance on addition of elements difficult to form a solid solution with Cu, such as B, Bi, C, Co, Fe, Hg, Ir, Mo, Na, Nb, Pb, V and Zr, to the conductor layer.

EXAMPLE 3

A magneto-resistance effect film was produced in the same way as in Example 1, except using Ag instead of Cu as a main component of the conductor layer and using Cu instead of Ag as an addition element to the conductor layer. Addition of Cu was accomplished by sputtering after setting a Cu chip 3 mm in diameter and 2 mm in thickness on an Ag target. The amount of addition of Cu to the conductor layer was 5 atomic percent. The above magneto-resistance effect film and a magneto-resistance effect film formed without Cu addition as a comparative example were heat-treated in vacuum at 230° C., 260° C., 290° C. and 320° C. for one hour and checked as to the rate of change of magneto-resistance in order to check the effect of addition of Cu to thermal resistance of the magneto-resistance effect film. The results are shown in FIG. 5.

Figure 5:
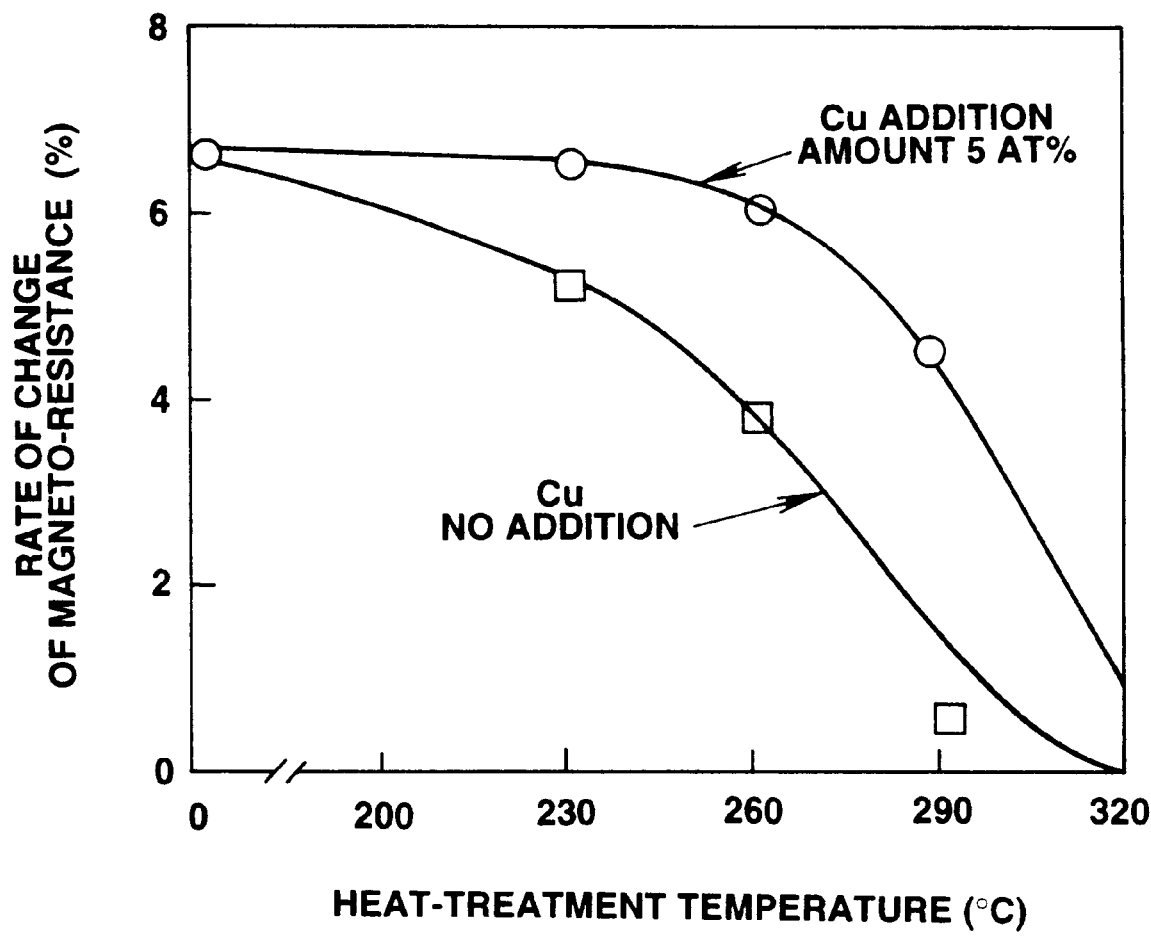
FIG. 5. is a graph showing the results of measurement of the change in the rate of change of magneto-resistance on heat treatment of the magneto-resistance effect film of an artificial lattice film structure the main component of the conductor layer of which is Ag, for different amounts of addition of Cu to the conductor layer.

It is seen from the results shown in FIG. 5 that addition of Cu to the conductor layer leads to prevention of thermal deterioration of the magneto-resistance effect.

In Example 3, Cu was added to the conductor layer of the magneto-resistance effect film of an artificial lattice film structure the main component of the conductor layer of which was Ag. In addition, the magneto-resistance effect is seen to be improved in thermal resistance on addition of elements difficult to form a solid solution with Cu, such as Be, Bi, Co, Cr, Cu, Fe, Ge, Ir, Ni, Pb, Si or U, to the conductor layer.

EXAMPLE 4

Figure 6:
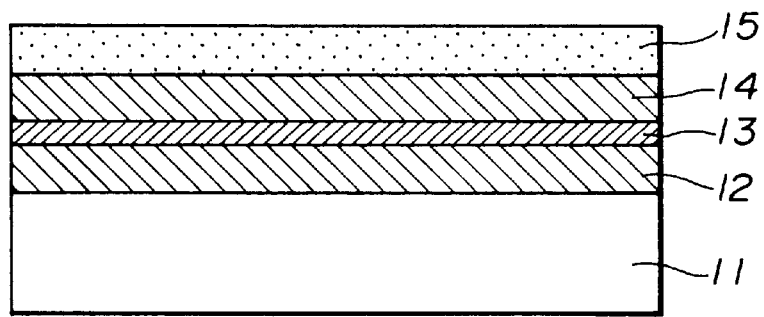
FIG. 6 is an enlarged schematic cross-sectional view showing an illustrative magneto-resistance effect film of a spin bulb structure according to the present invention.

Using a sputtering device, as in Example 1, a magnetic layer 12 of permalloy 200 nm in thickness, a conductor layer 13 of 5 nm in thickness, mainly composed of Cu and admixed with Ag, an element difficult to form a solid solution with Cu, a magnetic layer 14 of permalloy, 200 nm in thickness, and a diamagnetic layer 15 of $Fe_{50}Mn_{50}$, 500 nm in thickness, were laminated in that order on a ferrite base plate 11 to complete a magneto-resistance effect film of a spin bulb structure, as shown in FIG. 6.

For forming the above magneto-resistance effect film of the spin bulb structure, the following film forming conditions for the respective films were used:

Sputtering gas: argon

Sputtering gas pressure: 0.5 Pa

Power: 300 W

Film-forming Rate: 0.1 to 0.5 nm/sec

As in Example 1, Ag was added to Cu by performing sputtering after setting an Ag chip 3 mm in diameter and 2 mm in thickness on a Cu target. The amount of addition of Ag to the conductor layer was set to 5 wt %.

The above magneto-resistance effect film and the magneto-resistance effect film of the spin bulb structure formed without Ag addition as the comparative example were heat-treated in a vacuum at 230° C., 260° C., 290° C. and 320° C. for one hour and checked as to the rate of change of magneto-resistance in order to check the effect of addition of Cu on thermal resistance of the magneto-resistance effect film. The results are shown in FIG. 7.

Figure 7:
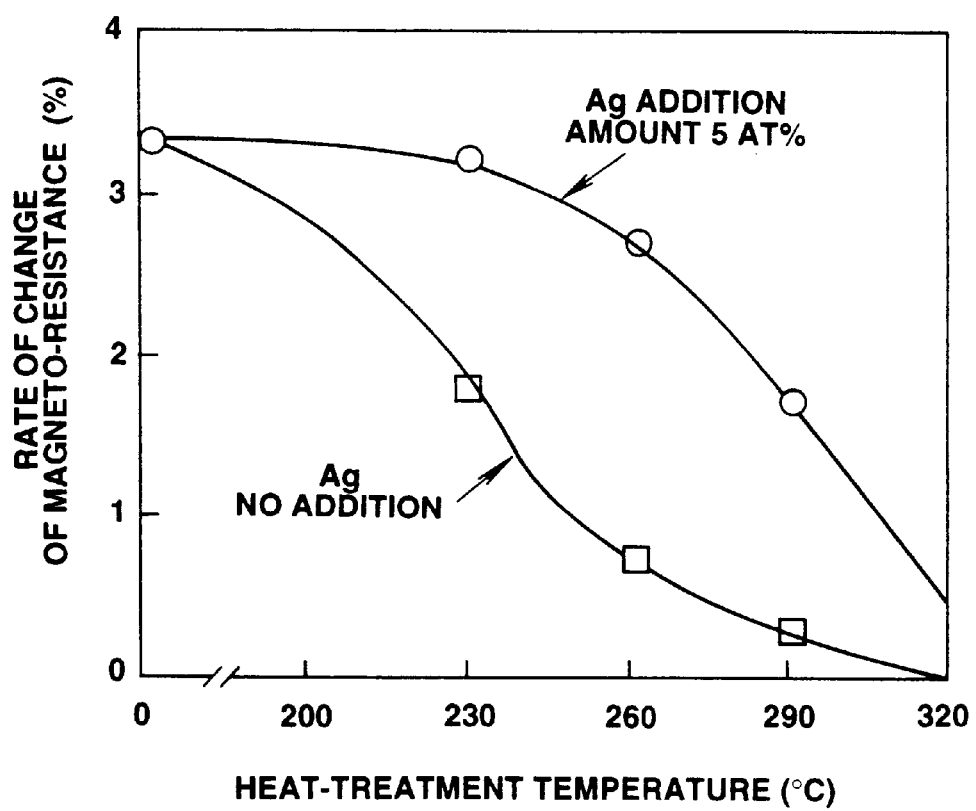
FIG. 7 is a graph showing the results of measurement of the change in the rate of change of magneto-resistance on heat treatment of the magneto-resistance effect film of a spin bulb structure the main component of the conductor layer of which is Cu, for different amounts of addition of Ag to the conductor layer.

It is seen from the results shown in FIG. 7 that addition of Ag to the conductor layer leads to prevention of thermal deterioration of the magneto-resistance effect.

EXAMPLE 5

A magneto-resistance effect film was formed in the same way as in Example 4, except Pt was used in place of Ag as an addition element to the conductor layer. For adding Pt, sputtering was carried out after setting a Pt chip 3 mm in diameter and 2 mm in thickness on a Cu target. The amount of addition of Cu was controlled depending on the number of chips set on the Cu target, so that the amount of addition of Pt to the conductor layer was 5 atom percent.

With the above-described magneto-resistance effect film, the magneto-resistance effect film was seen to be improved in thermal resistance. Thus, with the magneto-resistance effect film of the spin bulb structure, the magneto-resistance effect film can be prevented from thermally deteriorating by adding Pt to the conductor layer.

In Example 4, Ag was added to a conductor layer of a magneto-resistance effect film of a spin bulb structure the main component of the conductor layer of which was Cu, whereas, in Example 5, Pt was added to a conductor layer of a magneto-resistance effect film of a spin bulb structure the main component of the conductor layer of which was Cu. In addition, the magneto-resistance effect is seen to be improved in thermal resistance on addition of elements difficult to form a solid solution with Cu, such as B, Bi, C, Co, Fe, Hg, Ir, Mo, Na, Nb, Pb, V or Zr, to the conductor layer.

EXAMPLE 6

For checking whether or not thermal resistance of the magneto-resistance effect film varies depending on the elements added to the conductor layer, magneto-resistance effect films were prepared in the same manner as in Example 1 except changing the addition element to the conductor layer to Ag, B, Bi, C, Co, Fe, Hg, Ir, Mo, Na, Nb, Pb, V and Zr. For comparative examples, magneto-resistance effect films were similarly formed, however, by adding elements Mn, Ni and Si to the conductor layer. The amount of addition in the respective magneto-resistance effect films was set to 5 atomic percent.

For the respective magneto-resistance effect films, the rate of change of magneto-resistance prior to heat treatment and the rate of change of magneto-resistance effect after heat treatment in a vacuum at 310° C. for one hour were measured and the effect of the types of the elements added to the conductor layer on thermal resistance of the magneto-resistance effect film was evaluated according to the following three stages:

O: ratio of change of rate of magneto-resistance prior to heat treatment to that subsequent to heat treatment being not less than 50%.

Δ: ratio of change of rate of magneto-resistance prior to heat treatment to that subsequent to heat treatment being not less than 30% and less than 50%.

x: ratio of change of rate of magneto-resistance prior to heat treatment to that subsequent to heat treatment being less than 30%.

Meanwhile, if the addition element was not added to the conductor layer, the ratio of change of rate of magneto-resistance prior to heat treatment to that subsequent to heat treatment was on the order of 20%.

The results of the above evaluation are shown below in Table 1.

TABLE 1

| Addition Element | Evaluation Result |
| --- | --- |
| Ag | o |
| B | Δ |
| Bi | Δ |
| C | Δ |
| Co | o |
| Fe | o |
| Hg | Δ |
| Ir | Δ |

TABLE 1-continued

| Addition Element | Evaluation Result |
| --- | --- |
| Mo | Δ |
| Na | Δ |
| Nb | o |
| Pb | Δ |
| Pt | Δ |
| V | Δ |
| Zr | o |
| Mn | x |
| Ni | x |
| Si | x |

It is seen from the results of Table 1 that, if any of Ag, B, Bi, C, Co, Fe, Hg, Ir, Mo, Na, Nb, Pb, Pt, V or Zr, which are elements only difficult to form a solid solution with the conductor layer, is used as an addition element, it is possible to prevent thermal deterioration of the magneto-resistance effect film, and that the use as an addition element of Mn, Ni or Si, which are elements capable of easily forming a solid solution with the conductor layer is not effective to prevent thermal deterioration of the magneto-resistance effect film.

EXAMPLE 7

In this Example, which is similar to Example 1, using a sputtering device, a magnetic layer mainly composed of $Fe_{20}Ni_{45}Co_{35}$, and admixed with Ag, an element less prone to form a solid solution with FeNiCo, 1.0 nm in thickness, and a conductor layer 3 of Cu, 2.1 nm in thickness were alternately laminated with 30 iterations to form a magneto-resistance effect film of an artificial lattice film structure on NiZu base plate, having a heat conductivity of 7.5 W/mK.

For forming the above magneto-resistance effect film of the artificial lattice film structure, the following film forming conditions for the respective films were used:

Sputtering gas: argon

Sputtering gas pressure: 0.3 Pa

Power: 300 W

Film-forming rate: 0.1 to 0.5 nm/sec.

With the above magneto-resistance film, Ag was added to $Fe_{20}Ni_{45}Co_{35}$ as the main component of the magnetic layer by performing sputtering after setting an Ag chip 3 mm in diameter and 2 mm in thickness on a FeNiCo target. The amount of the addition of Ag was controlled depending on the number of chips set on the FeNiCo target.

The effect of the amount of addition of Ag on the thermal resistance of the magneto-resistance effect film was measured. Using magneto-resistance effect films, produced as described above with the amounts of Ag to the magnetic layer being set to 0.1, 5, 30 and 40 atomic percents, and a magneto-resistance effect film formed without adding Ag as a comparative example, heat-treatment was carried out on these magneto-resistance effect films in a vacuum at 230° C., 260° C., 290° C. and 320° C. for one hour. The rate of change of magneto-resistance was checked of each film. The results are shown in FIG. 8.

Figure 8:
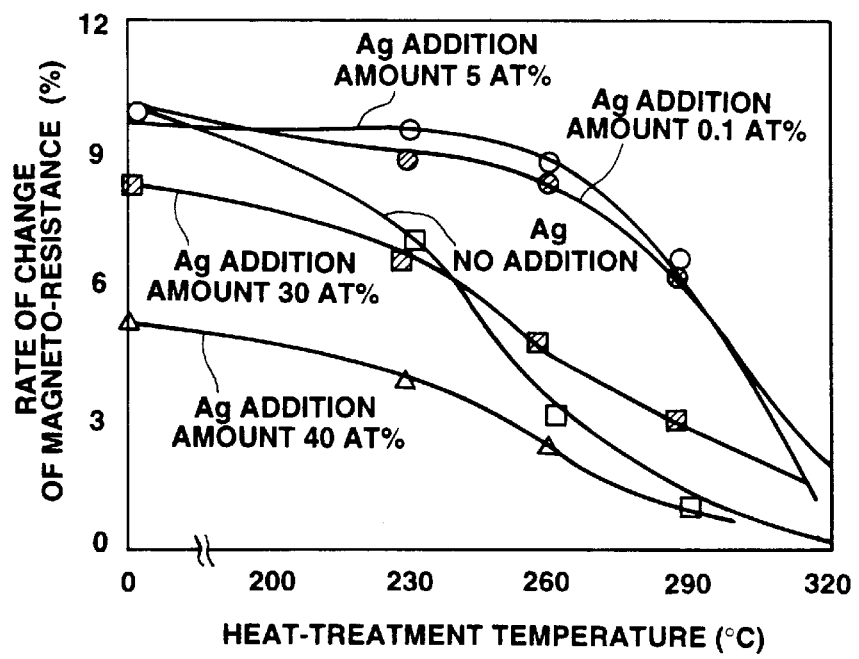
FIG. 8 is a graph showing the results of measurement of the change in the rate of change of magneto-resistance on heat treatment of the magneto-resistance effect film of an artificial lattice structure the main component of the magnetic layer of which is FeNiCo, for different amounts of addition of Ag to the magnetic layer.

It is seen from the results shown in FIG. 8 that appropriate addition of Ag to the magnetic layer is effective to prevent thermal deterioration of the magneto-resistance effect. It is also seen that, if Ag is added in an amount exceeding 0.1 atomic percent, the effect of preventing thermal deterioration is noticed. However, it is also seen that, if Ag is added in an amount of 40 atomic percent, the magneto-resistance effect in the initial state prior to heat treatment (rate of exchange of magneto-resistance) is unfavorably decreased.

That is, Ag is to be added in an amount preferably of 0.1 to 30 atomic percent.

In Example 7, Ag is added to the magnetic layer of the magneto-resistance effect film of an artificial lattice film structure the main component of the magnetic layer of which is FeNiCo. However, the magneto-resistance effect is seen to be improved in thermal resistance on addition of elements difficult to form a solid solution with Cu, such as B, Bi, Co, Cr, Cu, Fe, Hg, Ir, Li, Mo, Na, Nb, Pb, V, Pt or Zr, to the magnetic layer.

EXAMPLE 8

For checking whether or not the thermal resistance of the magneto-resistance effect film is changed depending on the kinds of the elements added to the magnetic layer, magneto-resistance effect films were prepared in the same manner as in Example 7 except changing the addition elements to the magnetic layer to Ag, B, Bi, C, Co, Fe, Hg, Ir, Li, Mo, Na, Nb, Pb, V, Pt and Zr. For comparative examples, magneto-resistance effect films were similarly formed by adding elements Al and Ti to the magnetic layer. The amount of addition of the addition elements in the respective magneto-resistance effect films was set to 5 atomic percent.

For respective magneto-resistance effect films, the rate of change of magneto-resistance prior to heat treatment and the rate of change of magneto-resistance effect after heat treatment in vacuum at 290° C. for one hour were measured and the effect of the types of the elements added to the conductor layer was evaluated according to the following:

O: ratio of change of rate of magneto-resistance prior to heat treatment to that subsequent to heat treatment being not less than 50%.

Δ: ratio of change of rate of magneto-resistance prior to heat treatment to that subsequent to heat treatment being not less than 30% and less than 50%.

x: ratio of change of rate of magneto-resistance prior to heat treatment to that subsequent to heat treatment being less than 30%.

Meanwhile, if the addition element is not added to the magnetic layer, the ratio of change of rate of magneto-resistance prior to heat treatment to that subsequent to heat treatment is on the order of 20%.

The results of evaluation are shown in Table 2.

TABLE 2

| Addition Element | Evaluation Result |
|---|---|
| Ag | O |
| B | Δ |
| Bi | Δ |
| C | Δ |
| Co | O |
| Cr | O |
| Fe | O |
| Hg | Δ |
| Ir | Δ |
| Li | Δ |
| Mo | Δ |
| Na | Δ |
| Nb | Δ |
| Pb | Δ |
| Pt | Δ |
| V | O |
| Zr | O |
| Al | x |
| Ti | x |

It is seen from the results of Table 2 that, if Ag, B, Bi, C, Co, Cr, Fe, Hg, Ir, Mo, Na, Nb, Pb, V, Pt or Zr, which are elements only difficult to form a solid solution with the magnetic layer, are used as addition elements, it is possible to prevent thermal deterioration of the magneto-resistance effect film, and that the use of Al or Ti, which are elements capable of easily forming a solid solution with the conductor layer, as addition elements, is not effective to prevent thermal deterioration of the magneto-resistance effect.

It is seen from above that, with the magneto-resistance effect film of the present invention, deterioration of the magneto-resistance effect characteristics can hardly occur and the giant magneto-resistance effect can be achieved in stability.

The embodiments wherein an MR device is formed with a base plate having a heat conductivity of not less than 2 W/mK are discussed next.

No matter whether the multi-layer magneto-resistance effect film construction is of the artificial lattice film structure or the spin bulb structure, if the base plate on which to form the multi-layer magneto-resistance effect film structure has high heat conductivity, in accordance with another aspect of the present invention, there is no risk of deterioration of the magneto-resistance effect even if the current of high current density is used for actuating the magneto-resistance effect device. The reason is that, if the current with high current density is caused to flow through the multi-layer magneto-resistance effect film construction, heat is dissipated from the base plate to prevent heat evolution so that there is no risk of disturbing the array of magnetization.

On the other hand, if the current of high current density is continuously supplied for prolonged time or the heat is applied from outside, there is no heat diffusion through metal portions between the respective films of the multi-layer magneto-resistance effect film construction, since there is no heat accumulated in the vicinity of the multi-layer magneto-resistance effect film construction.

In addition, since the non-magnetic film of the multi-layer magneto-resistance effect film construction of the magneto-resistance effect device according to the present invention is mainly composed of at least one of Cu, Ag and Cr, the giant magneto-resistance effect is more likely to be produced.

EXAMPLE 9

In this embodiment, a multi-layer magneto-resistance effect film of an artificial lattice film type is formed on an Si base plate.

Figure 9:
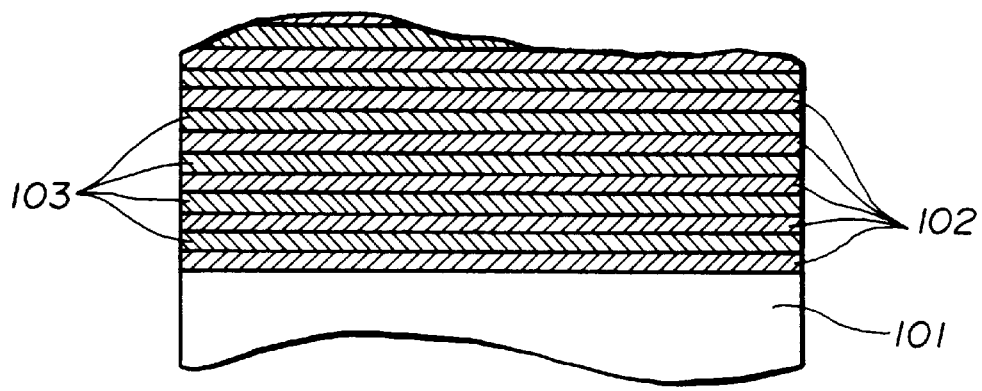
FIG. 9 is a schematic cross-sectional view showing an example of a magneto-resistance effect device of an artificial lattice film structure.

As schematically shown in FIG. 9, the magneto-resistance effect device has a base plate of Si, having heat conductivity at 300 K equal to 148 W/mK, and 30 iterations of alternate laminations of magnetic films 103 having the composition of $Fe_{20}$—$Ni_{45}$—$Co_{35}$ and non-magnetic films 102 of Cu, deposited on the base plate 101. The film thicknesses of the non-magnetic film 2 and the magnetic films 3 are 2.1 to 2.3 nm and 1.0 nm, respectively.

Figure 11:
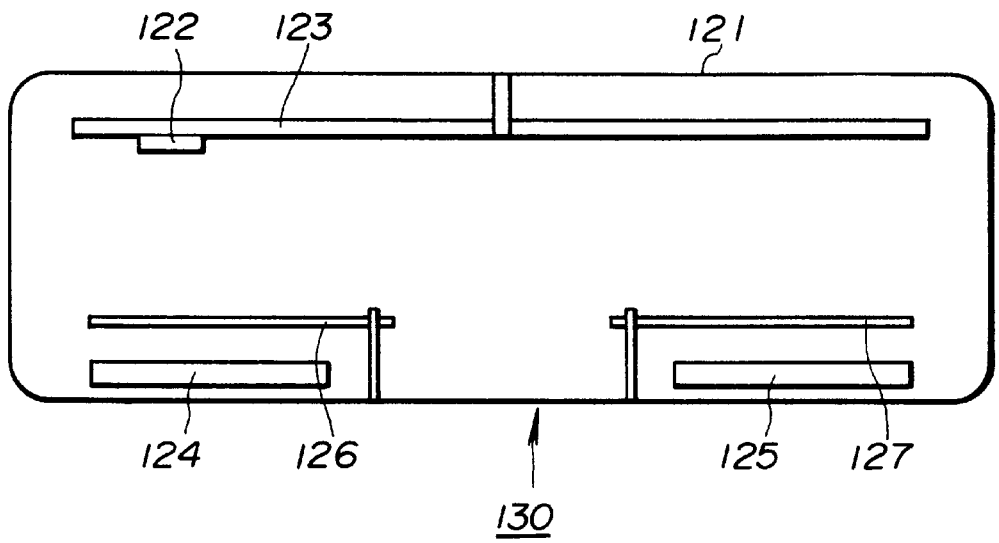
FIG. 11 is a schematic plan view showing a RF magnetron sputtering device employed for fabricating the magneto-resistance effect device according to the present invention.

For producing the magneto-resistance effect device, an RF magnetron sputtering device 130 shown in FIG. 11 was employed. The RF sputtering device 130 has a chamber 121 within which there are mounted a base plate holder 122 for holding the base plate 101, a rotary plate 123 for rotating the base plate 101, a target 124 formed of $Fe_{20}$—$Ni_{45}$—$Co_{35}$, a target 125 of Cu, and a pair of shutters 126, 127 for controlling the start/stop of film formation on the base plate 101. Although not shown, a gas inlet for introducing a sputtering gas into the chamber 121 and a vent for discharging the used gas are provided in the chamber 121.

For forming the magnetic films 103 and the non-magnetic films 102, using the above-described magnetron sputtering device 130, the chamber 121 is evacuated via the discharge opening and the sputtering gas is introduced via the gas inlet opening. The targets 124 and 125 are sputtered, while the non-magnetic base plate 101 is kept in rotation by the rotary plate 123, with the shutters 126 and 127 remaining closed. For forming the magnetic film 103, the shutter 126 on the target 124 is opened, whereas, for forming the non-magnetic film 102, the shutter 126 is closed, while the shutter on the target 125 is opened. By changing over the shutters 126 or 127 to be opened in this manner, the magnetic films 103 of $Fe_{20}$—$Ni_{45}$—$Co_{35}$ and the nonmagnetic films 102 of Cu are alternately deposited on the non-magnetic base plate 101. The following conditions were used for forming the magnetic films 103 and the non-magnetic films 102.

Film-forming Conditions

Sputtering gas: argon

Vacuum Reached: 1×10–4 Pa or less

Argon Gas Pressure: 0.3 Pa

Power: 300 W

Film-Forming Speed: 0.1 to 0.5 nm/sec

An artificial lattice film, having 30 layers of the non-magnetic films 102 and 30 layers of the magnetic films 103 laminated on the base plate 101, was formed in this manner to complete a magneto-resistance effect device.

EXAMPLE 10

This embodiment concerns a magneto-resistance effect device having a base plate of Si on which is formed a multi-layer magneto-resistance effect film of a spin bulb film type.

Figure 10:
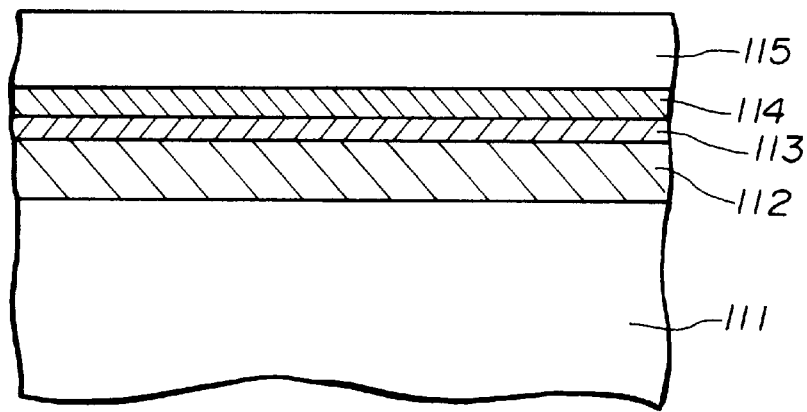
FIG. 10 is a schematic cross-sectional view showing an example of a magneto-resistance effect device of a spin bulb structure.

As schematically shown in FIG. 10, the magneto-resistance effect device includes a base plate 111 of Si, on which are formed a lower magnetic film 112 of permalloy, a non-magnetic film 113 of Cu, an upper magnetic film 114 of permalloy and a diamagnetic film 115 of a $Fe_{50}$—$Mn_{50}$ alloy in this order to complete a multi-layer magneto-resistance effect film construction of a spin bulb structure. The film thicknesses of the lower magnetic film 112, non-magnetic film 113, upper magnetic film 114 and the diamagnetic film 115 were 6.0 nm, 2.2 nm, 6.0 nm and 8.0 nm, respectively.

For fabricating the above-described magneto-resistance effect device, an RF magnetron sputtering device shown in FIG. 11 was employed, as in Example 9. The following film forming conditions were used for forming the lower magnetic film 112, non-magnetic film 113 and the upper magnetic film 114.

Film-Forming Conditions for Forming the Lower Magnetic Film 112, Non-Magnetic Film 113 and Upper Magnetic Film 114

Sputtering Gas: argon

Vacuum reached: 1×10–4 Pa or less

Argon Gas Pressure: 0.5 Pa

Power: 300 W

Film-forming Speed: 0.1 to 0.5 nm/sec

Laminating Method: two-dimensional rotary sputtering for Cu and permalloy

EXPERIMENT 1

Changes in the rate of change of magneto-resistance (MR ratio) with respect to the density of the current flowing through the magneto-resistance effect device were checked.

Specifically, a magneto-resistance effect device, configured similarly to that of Example 9 except that the base plate 101 was formed of quartz glass ($SiO_2$) having heat conductivity of 1.38 W/mK, was produced, and the current of various current densities was caused to flow through the above magneto-resistance effect device and the magneto-resistance effect device of the previous embodiment for measuring the values of the MR ratio. The MR ratio keeping percentage relative to the MR ratio for the current density of 1×105 A/cm$^2$ was calculated. The results are shown in FIG. 12 in terms of the relation between the current density and the MR ratio keep percentage.

Figure 12:
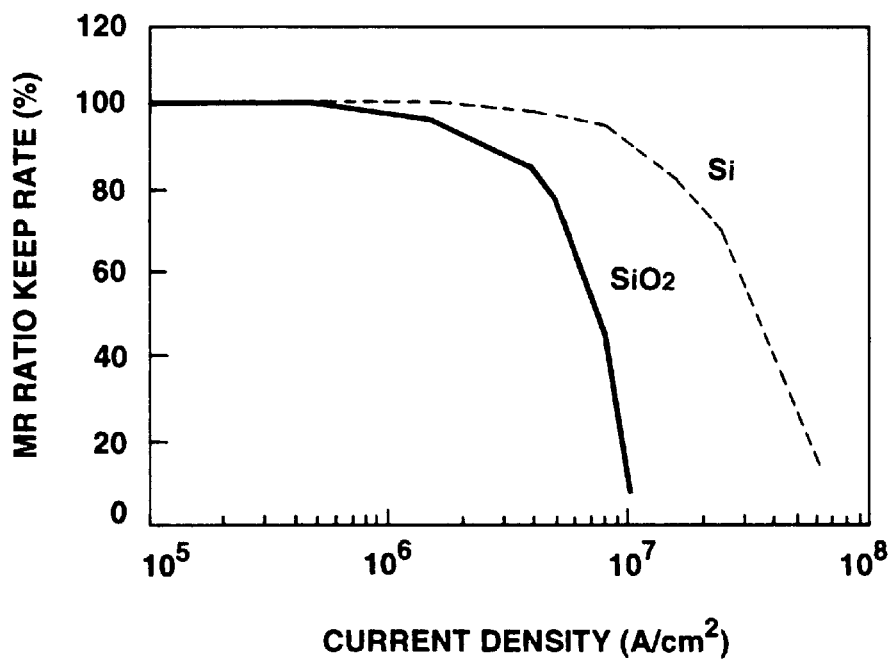
FIG. 12 a graph showing the relation between the current density and the MR ratio keeping percentage in a magneto-resistance effect device of an artificial lattice film structure.

It is seen from FIG. 12 that, with the use of the magneto-resistance effect device employing the base plate 101 composed of $SiO_2$, the MR ratio is deteriorated abruptly for the current density in excess of 1×10$^6$ A/cm$^2$, and that, for the current density of 9×10$^6$ A/cm$^2$, only the MR ratio less than 20% of that for the current density of 1×10$^5$ A/cm$^2$ can be achieved. On the other hand, with the magneto-resistance effect device employing the Si substrate 1, the MR ratio is not deteriorated even for the current density exceeding 1×10$^6$ A/cm$^2$. For the current density of 9×10$^6$ A/cm$^2$, the MR ratio equal to 90% of that for the current density of 1×10$^5$ A/cm$^2$ can be achieved.

Thus, it is seen that the higher the heat conductivity of the base plate material, the lesser is the deterioration in the MR ratio caused with increase in the current density.

EXPERIMENT 2

A magneto-resistance effect device, configured similarly to that of Example 10 except being formed of quartz glass ($SiO_2$) having heat conductivity of 1.38 W/mK, was produced. Currents of various current densities were caused to flow in the magneto-resistance effect device thus produced and through the magneto-resistance effect device of Example 10 in order to check the MR ratio keeping percentage as in Experiment 1. The results are shown in FIG. 13.

Figure 13:
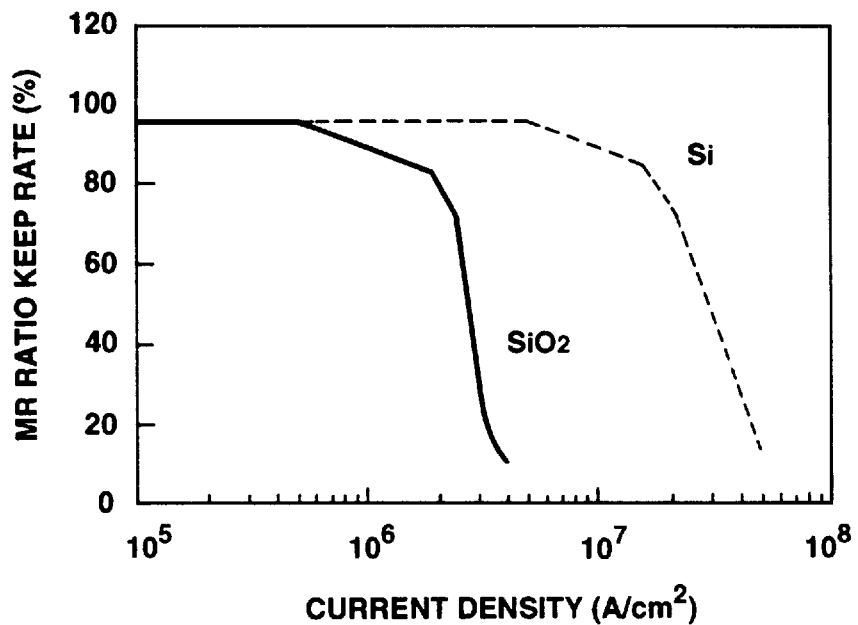
FIG. 13 is a graph showing the relation between the current density and the MR ratio keeping percentage in a magneto-resistance effect device of a spin bulb structure.

It is seen from FIG. 13 that, with the spin bulb magneto-resistance device of Example 10, the higher the heat conductivity of the base plate material 111, the lesser is the deterioration of the MR ratio with increase in the current density, as in the case of the artificial lattice film type magneto-resistance effect device.

EXPERIMENT 3

The relation between the heat conductivity of the base plate material and the MR ratio was then checked for the constant current density of the current flowing in the magneto-resistance effect device.

Specifically, the magneto-resistance effect device was produced in the same way as in Example 9, except using base plates of $SiO_2$, NiO—MnO and $Al_2O_3$—TiC in place of the Si base plate, and the values of the MR ratio for the current density of 9×10$^6$ A/cm$^2$ were measured. The MR ratio keeping percentage with respect to the MR ratio for the current of the current density of 1×10$^5$ A/cm$^2$ was calculated. The values of heat conductivity of the base plate material at 300 K and the calculated results of the MR ratio keeping percentage are shown in Table 3, in which the results of Example 9 for the Si base plate are also shown.

TABLE 1

| Substrate Material | Heat Conductivity (W/mK) | MR Ration Keep Rate (%) |
|---|---|---|
| $SiO_2$ | 1.38 | 18 |
| NiO—MnO | 4 | 28 |
| $Al_2O_3$—TiC | 17 | 50 |
| Si | 148 | 90 |

Figure 14:
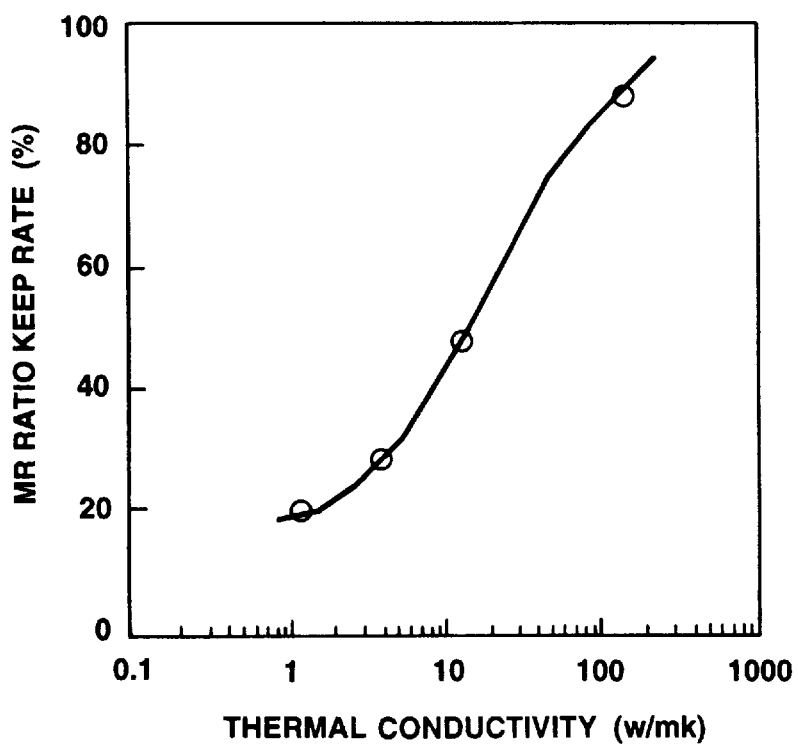
FIG. 14 is a graph showing the relation between heat conductivity of the base plate and the MR ratio keeping percentage.

The relation between the heat conductivity and the MR ratio keeping percentage is shown in the graph of FIG. 14.

It is seen from these results that the higher the value of heat conductivity of the base plate material, the higher becomes the MR ratio keeping percentage, that is, the more pronounced becomes the degree of suppression of deterioration of the MR ratio.

The MR ratio keeping percentage was checked of the spin bulb magneto-resistance effect device shown in Example 10, using the materials of different values of heat conductivity for the base plate 111. The results similar to those shown above were produced.

It is seen from the above that, according to the present invention, the magneto-resistance effect device in which the magneto-resistance effect is prevented from being deteriorated due to heat evolution during the operation may be produced.

Thus, if the magneto-resistance effect device according to the present invention is applied to, for example, a magnetic head, a high performance magnetic head may be produced which is capable of coping with higher recording density and more strict design conditions.

Although modifications and changes may be suggested by those skilled in the art, it is the intention of the inventors to embody within the patent warranted hereon all changes and modifications as reasonably and properly come within the scope of their contribution to the art.

We claim:

1. A magneto-resistance device, comprising:
   a base plate having a thermal conductivity greater than 2 W/mK;
   a magnetic layer, comprising $Fe_xNi_yCo_z$, said magnetic layer mainly comprising a main component selected from the group consisting of Fe, Co and Ni, said magnetic layer also containing 0.1 to 30 atomic percent of an addition element having an upper limit of solid solution at room temperature with respect to the main component of not more than 1.0%; and
   a conductor layer between the base plate and the magnetic layer, the conductor layer having a main component selected from the group consisting of Cu, Ag and Cr and containing 0.1 to 30 atomic percent of an addition element having an upper limit of solid solution at room temperature with respect to the main component of not more 1.0%;
   wherein the addition element in the conductor layer is selected from the group consisting of B, Bi, C, Co, Fe, Hg, Ir, Mo, Na, Nb, Pb, V, Be, and U.

2. The magneto-resistance device of claim 1, wherein said base plate has a thermal conductivity of at least 4 W/mK.

3. The magneto-resistance device of claim 1, wherein said base plate has a thermal conductivity of at least 17 W/mK.

4. The magneto-resistance device of claim 1, wherein said base plate has a thermal conductivity of at least 148 W/mK.

5. The magneto-resistance effect film as claimed in claim 1, wherein the main component of the conductor layer is Cu and the addition element contained in the conductor layer is an element selected from the group consisting of Ag, B, Bi, C, Co, Fe, Hg, Ir, Mo, Na, Nb, Pb, V, Pt and Zr.

6. The magneto-resistance effect film as claimed in claim 1, wherein the main component of the conductor layer is Ag and the addition element contained in the conductor layer is an element selected from the group consisting of Be, Bi, Co, Cr, Cu, Fe, Ge, Ir, Ni, Pb, Si, U.

7. The magneto-resistance effect device as claimed in claim 1, wherein said magneto-resistance effect film comprises an artificial lattice film made up of plurality of magnetic and non-magnetic films laminated alternately with each other.

8. The magneto-resistance effect device as claimed in claim 1, wherein said magneto-resistance effect film comprises a spin bulb film made up of the magnetic layer, the conductive layer and a further magnetic layer, laminated in that order.

9. The magneto-resistance effect device as claimed in claim 1, wherein said device exhibits a rate of change of magneto-resistance of at least 3 percent after heat treatment at 290° C.

10. The magneto-resistance device of claim 1, wherein the addition element in the conductor layer is B.

11. The magneto-resistance device of claim 1, wherein the addition element in the conductor layer is Bi.

12. The magneto-resistance device of claim 1, wherein the addition element in the conductor layer is C.

13. The magneto-resistance device of claim 1, wherein the addition element in the conductor layer is Hg.

14. The magneto-resistance device of claim 1, wherein the addition element in the conductor layer is Ir.

15. The magneto-resistance device of claim 1, wherein the addition element in the conductor layer is Mo.

16. The magneto-resistance device of claim 1, wherein the addition element in the conductor layer is Na.

17. The magneto-resistance device of claim 1, wherein the addition element in the conductor layer is Nb.

18. The magneto-resistance device of claim 1, wherein the addition element in the conductor layer is Pb.

19. The magneto-resistance device of claim 1, wherein the addition element in the conductor layer is V.

20. The magneto-resistance device of claim 1, wherein the addition element in conductor layer is Pt.

21. The magneto-resistance device of claim 1, wherein the addition element in the conductor layer is Zr.

22. The magneto-resistance device of claim 1, wherein the addition element in the conductor layer is Be.

23. The magneto-resistance device of claim 1, wherein the addition element in the conductor layer is Ge.

24. The magneto-resistance device of claim 1, wherein the addition element in the conductor layer is Si.

25. The magneto-resistance device of claim 1, wherein the addition element in the conductor layer is U.

26. A magneto-resistance device, comprising:
   a base plate having a thermal conductivity greater than 2 W/mK;
   a magnetic layer mainly comprising a main component selected from the group of Fe, Co and Ni, said magnetic layer also containing 0.1 to 30 atomic percent of an addition element having an upper limit of solid solution at room temperature with respect to the main component of not more than 1.0%; and
   a conductor layer between the base plate and the magnetic plate, the conductor layer having a main component selected from the group consisting of Cu, Ag and Cr and containing 0.1 to 30 atomic percent of an addition element having an upper limit of solid solution at room temperature with respect to the main component of not more than 1.0%;

wherein the addition element in the conductor layer is selected from the group consisting of B, Bi, C, Co, Fe, Hg, Ir, Mo, Na, Nb, Pb, V, Be, and U.

27. The magneto-resistance effect device as claimed in claim 26, wherein said magneto-resistance effect film comprises an artificial lattice film made up of plurality of magnetic and non-magnetic films laminated alternately with each other.

28. The magneto-resistance effect device as claimed in claim 26, wherein said magneto-resistance effect film comprises a spin bulb film made up the magnetic layer, the conductive layer and a further magnetic layer, laminated in that order.

29. The magneto-resistance effect device as claimed in claim 26, wherein said device exhibits a rate of change of magneto-resistance of at least 3 percent after heat treatment at 290° C.

* * * * *